(12) United States Patent
Sasaki

(10) Patent No.: US 10,263,182 B2
(45) Date of Patent: Apr. 16, 2019

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/713,029

(22) Filed: Sep. 22, 2017

(65) Prior Publication Data

US 2018/0090677 A1    Mar. 29, 2018

(30) Foreign Application Priority Data

Sep. 29, 2016 (JP) .................................. 2016-192007

(51) Int. Cl.
| | | |
|---|---|---|
| *H01L 43/10* | (2006.01) | |
| *H01L 43/08* | (2006.01) | |
| *H01L 43/02* | (2006.01) | |
| *H01L 43/06* | (2006.01) | |

(52) U.S. Cl.
CPC .............. *H01L 43/10* (2013.01); *H01L 43/02* (2013.01); *H01L 43/08* (2013.01); *H01L 43/06* (2013.01)

(58) Field of Classification Search
None
See application file for complete search history.

(56) References Cited

U.S. PATENT DOCUMENTS

| | | | | |
|---|---|---|---|---|
| 2002/0036315 | A1* | 3/2002 | Adachi | ............... B82Y 25/00 |
| | | | | 360/324.2 |
| 2005/0030676 | A1* | 2/2005 | Fukuzawa | ........... B82Y 10/00 |
| | | | | 360/325 |
| 2012/0091548 | A1 | 4/2012 | Sukegawa et al. | |
| 2013/0003579 | A1 | 1/2013 | Lu et al. | |
| 2013/0221461 | A1 | 8/2013 | Sukegawa et al. | |

FOREIGN PATENT DOCUMENTS

| | | |
|---|---|---|
| JP | 2013-175615 A | 9/2013 |
| JP | 5586028 B2 | 9/2014 |
| JP | 5588019 B2 | 9/2014 |

OTHER PUBLICATIONS

National Institute for Materials Science, "Atom Work", retrieved on Aug. 23, 2016, Internet, URL:http://crystdb.nims.go.jp/.
Yibin Xu, et al. "Inorganic Materials Database for Exploring the Nature of Material". Jpn. J. Appl. Phys, vol. 50, 11RH02,2011.

(Continued)

*Primary Examiner* — James G Norman
(74) *Attorney, Agent, or Firm* — Oliff PLC

(57) ABSTRACT

A magnetoresistance effect element is capable of realizing a high magnetoresistance (MR) ratio. The magnetoresistance effect element includes a laminate in which: an underlayer; a first ferromagnetic metal layer; a tunnel barrier layer; and a second ferromagnetic metal layer are laminated in that order. The underlayer is made of a nitride, the tunnel barrier layer is made of any one selected from a group consisting of $MgAl_2O_4$, $ZnAl_2O_4$, $MgO$, and $\gamma\text{-}Al_2O_3$, and a degree of lattice mismatching between a lattice constant of the tunnel barrier layer and a lattice constant of a crystal structure to be taken by the underlayer is 5% or less.

20 Claims, 4 Drawing Sheets

(56) References Cited

OTHER PUBLICATIONS

Hiroaki Sukegawa, et al. "Tunnel magnetoresistance with improved bias voltage dependence in lattice-matched Fe/spinel MgAl2O4/Fe(001) junctions". Applied Physics Letters, vol. 96, 212505, 2010.

Thomas Scheike, et all. "Lattice-matched magnetic tunnel junctions using a Heusler alloy Co2FeAl and a cationdisorder spinel Mg—Al—O barrier". Applied Physics Letters, vol. 105, 242407, 2014.

Yoshio Miura, et al. "First-principles study of tunneling magnetoresistance in Fe/MgAl2O4/Fe(001) magnetic tunnel junctions". Physical Review B, vol. 86, 024426, 2012.

Hiroaki Sukegawa, et al. "Enhanced tunnel magnetoresistance in a spinel oxide barrier with cation-site disorder". Physical Review B, vol. 86, 184401, 2012.

* cited by examiner

MAGNETORESISTANCE EFFECT ELEMENT

BACKGROUND OF THE INVENTION

Field of the Invention

The present invention relates to a magnetoresistance effect element. Priority is claimed on Japanese Patent Application No. 2016-192007, filed Sep. 29, 2016, the content of which is incorporated herein by reference.

Description of Related Art

A giant magnetoresistance (GMR) element made of a multilayer film including a ferromagnetic layer and a nonmagnetic layer and a tunnel magnetoresistance (TMR) element in which an insulating layer (a tunnel barrier layer, a barrier layer) is used for the nonmagnetic layer are known. Generally, although a TMR element has a higher element resistance as compared with a GMR element, a TMR element has a larger magnetoresistance (MR) ratio than an MR ratio of a GMR element. Therefore, attention is focused on a TMR element as an element for magnetic sensors, high frequency components, magnetic heads, and magnetic random access memories (MRAMs).

TMR elements can be classified into two types by a difference in mechanism of electron tunnel conduction. One is a TMR element utilizing only a leaking effect (tunnel effect) of a wave function between ferromagnetic layers. The other is a TMR element dominated by a coherent tunnel (only electrons having symmetry of a specific wave function tunnel) utilizing conduction of a specific orbit of the nonmagnetic insulating layer to be tunneled when a tunneling effect occurs. It is known that a TMR element in which a coherent tunnel is dominant can obtain a larger MR ratio as compared with a TMR element using only the tunnel effect.

To obtain the coherent tunnel effect in a magnetoresistance effect element, it is necessary that two ferromagnetic metal layers and a tunnel barrier layer are all crystalline and interfaces between the two ferromagnetic metal layers and the tunnel barrier layer are crystallographically continuous.

MgO is widely known as a tunnel barrier layer capable of obtaining the coherent tunnel effect. Research on materials able to be substituted for MgO is also in progress. For example, in JP5586028B, $MgAl_2O_4$ having a spinel structure has been reported as an alternative material to MgO. In addition, JP2013-175615A describes that $MgAl_2O_4$ having a disordered spinel structure is used for a tunnel barrier layer.

SUMMARY OF THE INVENTION

However, even though a tunnel barrier layer and a ferromagnetic layer have good lattice matching property, they cannot be directly applied to mass production. For example, in a magnetic head, it may be necessary to install a magnetic shield at a position below the magnetoresistance effect element.

Also, in a magnetic random access memory (MRAM), it may be necessary to install a semiconductor circuit at a position below a magnetoresistance effect element. That is, there are cases in which selection of materials is limited in mass production. To avoid such limitation, there is a method of using a seed layer material that readily crystallizes and is suitable for the crystal structure of constituent elements of a magnetoresistance effect element, but there is a problem in mass production because it is necessary to increase the film thickness to secure crystalline properties of the seed layer, or the like.

In such a problem, when the material constituting the tunnel barrier layer is changed from MgO to other materials, a sufficient magnetoresistance (MR) ratio may not be able to be obtained in some cases.

For example, in JP5586028B and JP2013-175615A, a lattice mismatch between the tunnel barrier layer and the ferromagnetic layer is reduced and the MR ratio is increased. However, even when lattice matching is performed between the tunnel barrier layer and the ferromagnetic layer, a sufficient MR ratio cannot be obtained in some cases.

The present invention has been made in view of the above circumstances, and it is an object of the present invention to provide a magnetoresistance effect element which generates a higher MR ratio than that of a tunnel magnetoresistance (TMR) element using a conventional tunnel barrier under a high bias voltage.

As a result of intensive research, the present inventors have found that as the difference between a lattice constant of a crystal of a material constituting the tunnel barrier layer and a lattice constant of a crystal (inherently) taken by a nitride constituting an underlayer (as a bulk material) becomes smaller, the MR ratio becomes larger.

This finding contradicts with the conventional wisdom. Generally, it is said that a nitride film formed by a reactive sputtering method is amorphous. Thus, the underlayer formed by a reactive sputtering method is amorphous. Actually, crystalline properties of the underlayer have not been confirmed even from transmission electron microscope (TEM) images or electron beam diffraction images.

If the underlayer is perfectly amorphous, there should be no crystallographic correlation with the layer thereabove. On the other hand, the MR ratio obtained from results of this research reveals a correlation with the underlayer. When the reason for this is presumed, it is thought that the underlayer is neither completely crystallized nor completely amorphous. That is, the underlayer does not have regularly arranged atoms from which TEM images or electron beam diffraction images can be obtained, but it is thought to be closer to the reality that the underlayer has locally crystalline portions and has loose regularities leaving traces of a crystal structure. With respect to the current situation that the underlayer formed by a reactive sputtering method is assumed to be amorphous, adjusting the correlation between the underlayer and the tunnel barrier layer opens a new direction for improving the MR ratio of the magnetoresistance effect element.

(1) A magnetoresistance effect element according to one aspect of the present invention includes a laminate in which: an underlayer; a first ferromagnetic metal layer; a tunnel barrier layer; and a second ferromagnetic metal layer are laminated in that order, wherein the underlayer is made of a nitride, the tunnel barrier layer is made of any one selected from a group consisting of $MgAl_2O_4$, $ZnAl_2O_4$, MgO, and $\gamma\text{-}Al_2O_3$, and a degree of lattice mismatching between a lattice constant of the tunnel barrier layer and a lattice constant of a crystal structure to be (inherently) taken by the underlayer is 5% or less.

(2) In the magnetoresistance effect element according to the above-described aspect, the crystal structure to be taken by the underlayer may be a tetragonal crystal structure.

(3) In the magnetoresistance effect element according to the above-described aspect, the tunnel barrier layer may be $MgAl_2O_4$ or $ZnAl_2O_4$, and the underlayer may a nitride including any one selected from a group consisting of Ti, V, Mo, Ga, and Al.

(4) In the magnetoresistance effect element according to the above-described aspect, the tunnel barrier layer may be MgO; and the underlayer may a nitride including any one selected from a group consisting of Ti, Nb, V, Ta, and Mo.

(5) In the magnetoresistance effect element according to the above-described aspect, the tunnel barrier layer may be γ-Al$_2$O$_3$; and the underlayer may be a nitride including any one selected from a group consisting of V, Ga, and Al.

(6) In the magnetoresistance effect element according to the above-described aspect, an electrical resistivity of the underlayer may be 200 μΩ·cm or less.

(7) In the magnetoresistance effect element according to the above-described aspect, the first ferromagnetic metal layer and the second ferromagnetic metal layer may be made of a ferromagnetic material of which a main component is at least one of Fe and Co.

(8) In the magnetoresistance effect element according to the above-described aspect, a thickness of the first ferromagnetic metal layer may be 3 nm or less.

(9) In the magnetoresistance effect element according to the above-described aspect, a thickness of the underlayer may be 1.0 nm or more and 20.0 nm or less.

(10) In the magnetoresistance effect element according to the above-described aspect, a cap layer may be further laminated on a surface of the second ferromagnetic metal layer opposite to the tunnel barrier layer side.

(11) In the magnetoresistance effect element according to the above-described aspect, the cap layer may be made of a nonmagnetic metal having an atomic number of an atomic number of yttrium or higher.

According to the present invention, it is possible to provide a magnetoresistance effect element which generates a high magnetoresistance (MR) ratio.

DETAILED DESCRIPTION OF THE INVENTION

Figure 1:
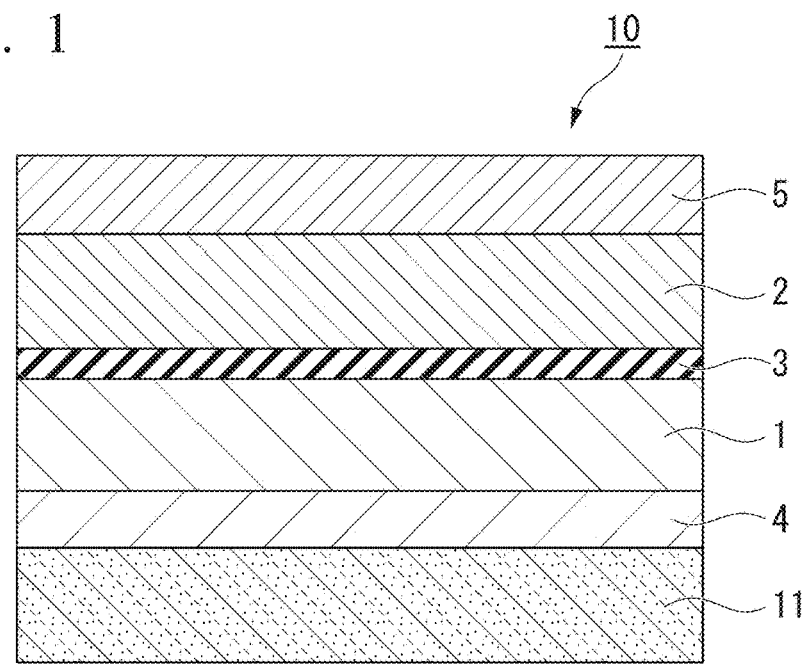
FIG. 1 is a schematic cross-sectional view of a magnetoresistance effect element according to the present embodiment.

Hereinafter, embodiments of the present invention will be described in detail with reference to the accompanying drawings. In the following description, the same elements will be denoted by the same reference characters and duplicate descriptions thereof will be omitted.

[Magnetoresistance Effect Element]

FIG. 1 is a schematic cross-sectional view of a magnetoresistance effect element according to the present embodiment. The magnetoresistance effect element 10 illustrated in FIG. 1 is provided on the substrate 11. In the magnetoresistance effect element 10, the underlayer 4, the first ferromagnetic metal layer 1, the tunnel barrier layer 3, the second ferromagnetic metal layer 2, and the cap layer 5 are laminated in that order from the substrate 11 side. The cap layer 5 is not an indispensable layer and may be excluded.

First, configurations of each layer constituting the magnetoresistance effect element 10 will be specifically described.

(First Ferromagnetic Metal Layer and Second Ferromagnetic Metal Layer)

As a material of the first ferromagnetic metal layer 1 and the second ferromagnetic metal layer 2, a ferromagnetic material, particularly a soft magnetic material is applied. A metal selected from the group consisting of Cr, Mn, Co, Fe, and Ni, an alloy containing one or more metals selected from this group, or an alloy containing one or more metals selected from this group and at least one element from B, C, and N, are examples. Specifically, Co—Fe, Co—Fe—B, or Ni—Fe can be exemplified.

Also, as materials of the first ferromagnetic metal layer 1 and the second ferromagnetic metal layer 2, the Heusler alloy such as Co$_2$FeSi can be used. The Heusler alloy has high spin polarizability and can realize a high magnetoresistance (MR) ratio. The Heusler alloy includes an intermetallic compound having a chemical composition of X$_2$YZ. X indicates Co, Fe, Ni, or a transition metal element of the Cu group, or a noble metal element in the periodic table. Y indicates Mn, V, Cr, or a transition metal of the Ti group, and it can also be elements of the type for X. Z indicates a typical element from Group III to Group V. Co$_2$FeSi, Co$_2$MnSi, Co$_2$Mn$_{1-a}$Fe$_a$Al$_b$Si$_{1-b}$, and the like are examples.

When a direction of magnetization of the first ferromagnetic metal layer 1 and the second ferromagnetic metal layer 2 is made perpendicular to a laminated surface, it is preferable that there is 3 mm or less of the ferromagnetic material. Perpendicular magnetic anisotropy can be added to the first ferromagnetic metal layer 1 and the second ferromagnetic metal layer 2 at interfaces with the tunnel barrier layer 3. In addition, since an effect of the perpendicular magnetic anisotropy is attenuated when film thicknesses of the first ferromagnetic metal layer 1 and the second ferromagnetic metal layer 2 are higher, it is preferable that the film thicknesses of the first ferromagnetic metal layer 1 and the second ferromagnetic metal layer 2 be small.

Also, an antiferromagnetic material such as IrMn, PtMn, or the like may be used as a material in contact with the second ferromagnetic metal layer 2 in order to make coercivity thereof higher than that of the first ferromagnetic metal layer 1. Further, a synthetic ferromagnetic coupling structure may be employed to prevent a leakage magnetic field of the second ferromagnetic metal layer 2 from affecting the first ferromagnetic metal layer 1.

When a direction of magnetization of the second ferromagnetic metal layer 2 is made perpendicular to the laminated surface, it is preferable to use a film in which Co and Pt are laminated. For example, when the second ferromagnetic metal layer 2 is made of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the direction of magnetization can be made perpendicular.

In general, since the direction of magnetization can be more easily changed by an external magnetic field or a spin torque than in the first ferromagnetic metal layer 1, the first ferromagnetic metal layer 1 is called a free layer. In addition, since the second ferromagnetic metal layer 2 has a structure in which the direction of magnetization is fixed, the second ferromagnetic metal layer 2 is called a fixed layer.

(Tunnel Barrier Layer)

The tunnel barrier layer 3 is made of a nonmagnetic insulating material. A film thickness of the tunnel barrier layer 3 is generally 3 nm or less. When the tunnel barrier layer 3 is sandwiched between metal materials, since a wave function of electrons contained in atoms of the metal materials spreads beyond the tunnel barrier layer 3, a current flows in spite of an insulator existing on the circuit. The magnetoresistance effect element 10 has a structure in which the tunnel barrier layer 3 is interposed between ferromagnetic metal materials (the first ferromagnetic metal layer 1 and the second ferromagnetic metal layer 2), and a resistance value is determined by a relative angle of the magnetization directions of each of the ferromagnetic metals sandwiching the tunnel barrier layer 3.

Regarding the magnetoresistance effect element 10, there may be one utilizing a normal tunnel effect and one having a dominant coherent tunnel effect in which a trajectory at the time of tunneling is restricted. In a normal tunnel effect, a magnetoresistance effect can be obtained due to spin polarizability of the ferromagnetic metal, but in the coherent tunnel, the trajectory at the time of tunneling is restricted. Therefore, in a magnetoresistance effect element in which a coherent tunnel is dominant, effects beyond those with spin polarizability of the ferromagnetic metal material can be expected. In order for the coherent tunnel effect to be exhibited, it is preferable that the ferromagnetic metal material and the tunnel barrier layer 3 be crystallized and bonded to each other in a specific orientation.

The tunnel barrier layer 3 is made of any one selected from a group consisting of $MgAl_2O_4$, $ZnAl_2O_4$, MgO, and $\gamma$-$Al_2O_3$. In addition, composition formulae shown here are shown as theoretical formulae and, in practice, include a range in which the ratio deviates from these composition formulae. For example, $MgAl_2O_{4-\alpha}$ ($\alpha$ is a real number) in which an oxygen vacancy occurs, $Mg_{1-\beta}Al_{2-\beta}O_4$ ($\beta$ is a real number) in which a ratio of Mg to Al changes, or the like is included.

The tunnel barrier layer 3 has a spinel structure or rock salt structure. MgO has a rock salt structure, and $MgAl_2O_4$, $ZnAl_2O_4$, and $\gamma$-$Al_2O_3$ have a spinel structure. The rock salt structure is a so-called NaCl-type structure in which Mg ions and oxygen ions are alternately arranged. On the other hand, the spindle structure stated here is a concept that includes both an ordered spinel structure and a Sukenel structure.

Figure 2:
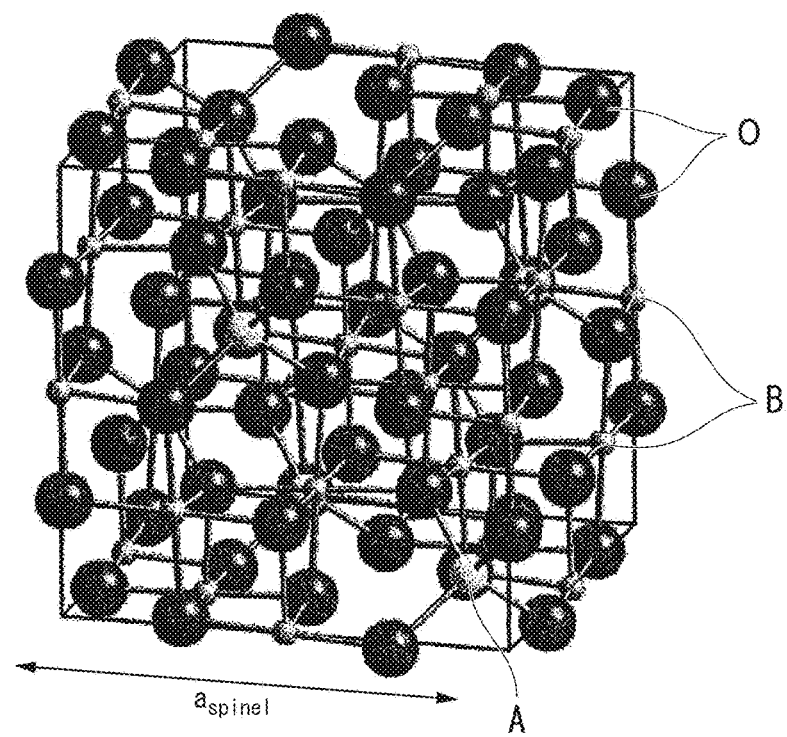
FIG. 2 is a view of a crystal structure of spinel.

FIG. 2 is a view schematically illustrating a spinel-type crystal structure. The spinel structure is a crystal structure constituted by cations and oxygen ions. In the spinel structure, portions at which cations are arranged are A sites tetra-coordinated with oxygen ions and B sites hexa-coordinated with oxygen ions. In FIG. 2, reference character O denotes oxygen ions, reference character A denotes the A sites, reference character B denotes the B sites, and reference character $a_{spinel}$ denotes a lattice constant of the spinel structure.

The Sukenel structure is a structure in which cations of the spinel structure are disordered. In the Sukenel structure, although an arrangement of oxygen ions assumes a cubic close-packed lattice that is almost equal to that of the spinel, an atomic arrangement of cations is disturbed. In the ordered spinel structure, cations are regularly arranged in tetrahedral voids and octahedral voids of oxygen ions. In contrast, in the Sukenel structure, cations are randomly arranged and the cations are positioned at tetrahedral positions and octahedral positions of oxygen atoms which are originally not supposed to occupy. As a result, symmetry of the crystal changes in the Sukenel structure, and a lattice constant thereof is substantially halved compared to that of the ordered spinel structure.

Figure 3:
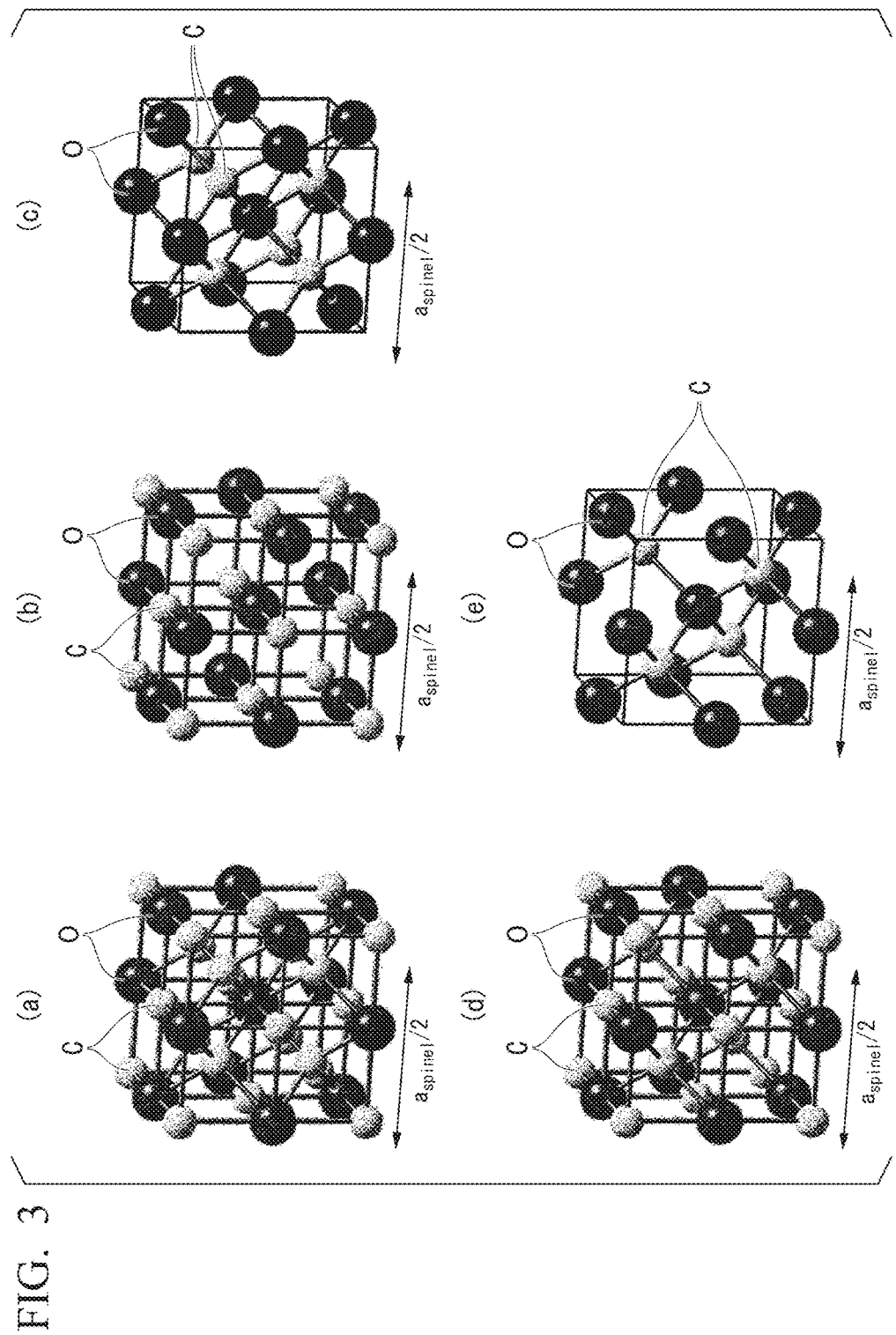
FIG. 3 is a view illustrating constituent units of an ordered spinel structure and a Sukenel structure.

FIG. 3 is a view illustrating constituent units of the ordered spinel structure and the Sukenel structure. The ordered spinel structure and the Sukenel structure can take five constituent units illustrated in FIGS. 3(a) to 3(e). FIGS. 3(a) to 3(c) have symmetry of space group of Fm-3m, and FIGS. 3(d) to 3(e) have symmetry of space group of F-43m. The Sukenel structure may be constituted by any one of these structures or may be constituted by a mixture of these structures. In FIGS. 3(a) to 3(e), reference character O denotes oxygen ions, reference character C denotes sites for cations to enter, and reference character $a_{spinel}/2$ denotes half of the lattice constant of the spinel structure, which means the lattice constant of the Sukenel structure. The sites for cations to enter correspond to either the A sites or B sites in FIG. 2.

For example, when the tunnel barrier layer 3 is made of $MgAl_2O_4$ or $ZnAl_2O_4$, the A sites are Mg or Zn which are nonmagnetic divalent cations and the B sites are Al. When the tunnel barrier layer 3 is $\gamma$-$Al_2O_3$, Al enters C sites and a portion thereof is lost.

When a unit of repetition of the lattice structure of the tunnel barrier layer 3 is changed, combination of the electronic structure (band structure) with the material constituting the ferromagnetic metal layer is changed, and large tunnel magnetoresistance (TMR) enhancement appears due to the coherent tunnel effect. For example, the space group of $MgAl_2O_4$ which is a nonmagnetic spinel material is Fd-3m, but the space group of a disordered spinel structure with halved lattice constant is changed to Fm-3m or F-43m.

The rock salt structure, the ordered spinel structure, and the Sukenel structure are classified as cubic crystals as a whole. Therefore, in principle, the tunnel barrier layer 3 also has a cubic crystal structure. On the other hand, the tunnel barrier layer 3 does not exist as a single bulk but is formed as a thin film. In addition, the tunnel barrier layer 3 does not exist as a single layer, but is a part of a laminate in which a plurality of layers are laminated. Therefore, the tunnel barrier layer 3 can take a crystal structure in which the cubic crystal is partially distorted. In general, distortion of the tunnel barrier layer 3 from the cubic crystal is small and depends on theccuracy of a measurement method for evaluating the structure.

(Underlayer)

The underlayer 4 is made of a nitride. For example, as a material constituting the underlayer 4, a nitride including any one selected from a group consisting of Ti, Nb, V. Hf, Ta, Mo, Ga, Zr, Al, and Ce, and the like are examples.

It is thought that the underlayer 4 is in a condition between a perfect crystalline state and an amorphous state. The underlayer 4 is generally formed by a reactive sputtering method. Since the reactive sputtering method is not for performing crystal growth, it has been generally believed that the underlayer is amorphous. As one proof thereof, crystalline properties was not confirmed in transmission electron microscope (TEM) images or electron beam diffraction images.

On the other hand, as a result of the research, it was found that the MR ratio of the magnetoresistance effect element 10 increased when the underlayer 4 and the tunnel barrier layer 3 are appropriately selected. If the underlayer 4 were completely amorphous, there should be no crystallographic correlation with a layer thereabove, however a phenomenon which cannot be explained unless it is thought that the underlayer 4 has some crystalline properties was confirmed.

TEM images or electron beam diffraction images allows to ascertain a spatial distribution of atoms by irradiating an object with electron beams and using intensity or interference images of electron beams passing through the object. Therefore, it is impossible to confirm the sufficient crystalline structure unless some degree of atom is present. In other word, the underlayer 4 does not have regularly arranged atoms from which TEM images or electron beam diffraction images can be obtained, but it is thought that the underlayer 4 has locally crystalline portions and has loose regularities leaving traces of a crystal structure The underlayer 4 preferably has high conductivity. Specifically, it is preferable that an electrical resistivity of the underlayer 4 be 200 μΩ·cm or less.

When magnetization reversal is performed using spin transfer torque (STT), a current flows in the lamination direction of the magnetoresistance effect element 10. Therefore, there is a case in which a metal layer is formed between the substrate 11 and the underlayer 4 to flow a current via the metal layer. If the underlayer 4 is made of a material having high conductivity, the underlayer 4 can be prevented from hindering the flow of current.

When a thickness of the underlayer 4 is small sufficient to allow the tunneling current to flow, or when the metal interconnection is connected to the side surface of the first ferromagnetic metal layer 1, the underlayer 4 may be an insulating layer.

The film thickness of the underlayer 4 is preferably 1.0 nm or more and 20.0 nm or less. When the film thickness of the underlayer is within this range, it is possible to reliably improve uniformity of the crystal size and the orientation in the tunnel barrier layer. In addition, since a nitride generally has a higher electrical resistivity as compared with a metal, when a nitride is used as the underlayer, it is preferable that the film thickness of the nitride be thin. When the film thickness of the nitride is decreased, resistance of the circuit including the magnetoresistance effect element is decreased, and thus the effective magnetoresistance ratio can be increased.

(Cap Layer 5)

It is preferable that the cap layer 5 be formed on a surface of the second ferromagnetic metal layer 2 opposite to the tunnel barrier layer 3. The cap layer 5 can suppress diffusion of elements from the second ferromagnetic metal layer 2. The cap layer 5 also contributes to crystal orientation of each layer of the magnetoresistance effect element 10. As a result, by providing the cap layer 5, magnetism of the first ferromagnetic metal layer 1 and the second ferromagnetic metal layer 2 of the magnetoresistance effect element 10 is stabilized, and resistance of the magnetoresistance effect element 10 can be lowered.

For the cap layer 5, it is preferable to use a material having high conductivity. For example, Ru, Ta Cu, Ag, Au, or the like can be used. In addition, the cap layer 5 is preferably made of a nonmagnetic metal having an atomic number of an atomic number of yttrium or higher. When the cap layer 5 is made of the nonmagnetic metal, spin is easily accumulated in the second ferromagnetic metal layer 2 and a high MR ratio can be realized.

It is preferable that a crystal structure of the cap layer 5 be appropriately set from the fcc structure, the hcp structure, or the bcc structure in accordance with a crystal structure of the adjacent ferromagnetic metal layer. A thickness of the cap layer 5 may be in a range in which a distortion mitigation effect is obtainable and further a decrease in MR ratio due to shunt is not observed, and it is preferably 1 nm or more and 30 nm or less.

A spin-orbit torque interconnection may be formed on the cap layer 5. Here, the spin-orbit torque interconnection extends in a direction intersecting the lamination direction of the magnetoresistance effect element 10, and the spin-orbit torque interconnection is electrically connected to a power supply which flows the current in the direction perpendicular to the lamination direction of the magnetoresistance effect element 10 and functions as a spin injection unit for injecting a pure spin current into the magnetoresistance effect element 10 together with the power supply.

The spin-orbit torque interconnection is made of a material in which a pure spin current is generated by the spin Hall effect when the current flows. Here, the spin Hall effect is the phenomenon in which a pure spin current is induced in a direction perpendicular to a current direction on the basis of spin orbit interaction when a current flows in the material.

(Substrate)

The magnetoresistance effect element 10 is formed on the substrate 11. As the substrate 11, it is preferable to use a material excellent in flatness. The substrate 11 varies depending on application of the product. For example, in a case of magnetic random access memory (MRAM), a circuit made of a Si substrate can be used under the magnetoresistance effect element. Alternatively, in a case of a magnetic head, an AlTiC substrate that is easily processed can be used.

Next, a relationship between the layers constituting the magnetoresistance effect element 10 will be specifically described.

(Relationship Between Tunnel Barrier Layer and Underlayer)

The underlayer 4 is selected so that a degree of lattice mismatching of a lattice constant of the crystal structure that the underlayer 4 can assume with respect to a lattice constant of the tunnel barrier layer 3 is 5% or less, and is preferably selected to be within 3%.

When the underlayer 4 is selected with respect to the tunnel barrier layer 3, the MR ratio of the magnetoresistance effect element 10 is improved. As described above, the underlayer 4 formed by the reactive sputtering method was thought to be amorphous. Therefore, it is a new discovery that matching property between the crystal structure of the tunnel barrier layer 3 and a crystal structure that the underlayer 4 can assume affects improvement of the MR ratio of the magnetoresistance effect element 10.

Here, the "crystal structure that the underlayer 4 can assume" means a crystal structure that can be (inherently) taken when the underlayer 4 is constituted by a bulk material and a crystal structure that the underlayer 4 is believed to have. As described above, it is conceivable that the underlayer 4 is in an intermediate condition between a perfect crystalline state and an amorphous state. Therefore, what structure the crystal structure of the underlayer 4 may have cannot be clearly defined. On the other hand, it is not believed that the crystal structure of the actual underlayer 4 is significantly different from the crystal structure that can be taken when the underlayer 4 is constituted by a bulk material. As the crystal structure that the underlayer 4 can assume, there is a tetragonal crystal structure.

In addition, the degree of lattice mismatching is defined as follows.

$$\text{Degree of lattice mismatching} = |A - nB|/nB \times 100 \quad (1)$$

In above formula (1), A is a lattice constant of the tunnel barrier layer 3, and B is a lattice constant of a crystal structure that the underlayer 4 can assume. N is a positive integer or 1/positive integer. When the tunnel barrier layer 3 has a spinel structure, A corresponds to $a_{spinel}$ of FIG. 2, and when the tunnel barrier layer 3 has a Sukenel structure, A corresponds to $a_{spinel}/2$ of FIG. 3.

When the tunnel barrier layer 3 is $MgAl_2O_4$ or $ZnAl_2O_4$, the underlayer 4 is preferably a nitride including any one selected from a group consisting of Ti, V, Mo, Ga, and Al, and more preferably a nitride including any one selected from a group consisting of V, Ga, and Al. From a viewpoint that the underlayer 4 has conductivity, it is more preferable that the underlayer 4 is a nitride including either V or Al.

When the tunnel barrier layer 3 is MgO, the underlayer 4 is preferably a nitride including any one selected from a group consisting of Ti, Nb, V, Ta and Mo, and more preferably a nitride including any one selected from a group consisting of Ti, V. Ta, and Mo. In addition, from the viewpoint that the underlayer 4 has conductivity, it is more preferable that the underlayer 4 is a nitride including any one selected from a group consisting of Ti, Nb, V, and Ta.

When the tunnel barrier layer 3 is γ-Al$_2$O$_3$, the underlayer 4 is preferably a nitride including any one selected from a group consisting of V, TG and Al, and the underlayer 4 is preferably a nitride including either Ga or Al. In addition, from the viewpoint that the underlayer 4 has conductivity, it is more preferable that the underlayer 4 is aluminum nitride (AlN).

(Relationship between Tunnel Barrier Layer, and First Ferromagnetic Metal Layer and Second Ferromagnetic Metal Layer)

The tunnel barrier layer 3 is preferably lattice-matched with the first ferromagnetic metal layer 1 and the second ferromagnetic metal layer 2. The first ferromagnetic metal layer 1 and the second ferromagnetic metal layer 2 are adjacent to the tunnel barrier layer 3 and have a large influence on the crystal structure of the tunnel barrier layer 3.

It is preferable that the tunnel barrier layer 3 partially have a lattice matching portion lattice-matched with both the first ferromagnetic metal layer 1 and the second ferromagnetic metal layer 2. Generally, it is preferable that the tunnel barrier layer 3 be lattice-matched as a whole with both the first ferromagnetic metal layer 1 and the second ferromagnetic metal layer 2. However, when the whole is lattice-matched, spin-polarized electrons interfere with each other at the time of passing through the tunnel barrier layer 3, and thus the electrons cannot easily pass through the tunnel barrier layer 3.

When the lattice matching portion lattice-matched is partially present, interference of the spin-polarized electrons at a portion which is not lattice-matched is moderately prevented at the time of passing through the tunnel barrier layer 3, and the spin-polarized electrons easily pass through the tunnel barrier layer 3. A volume ratio of the lattice matching portion in the tunnel barrier layer 3 with respect to a volume of the entire tunnel barrier layer 3 is preferably 70 to 95%. When the volume ratio of the lattice matching portion in the tunnel barrier layer 3 is 70% or less, the coherent tunnel effect decreases and the MR ratio decreases. Also, when the volume ratio of the lattice matching portion in the tunnel barrier layer 3 exceeds 95%, the effect of spin-polarized electrons interfering with each other at the time of passing through the tunnel barrier layer 3 cannot be weakened and no increase in the effect of spin-polarized electrons passing through the tunnel barrier layer 3 is observed.

The volume ratio of the lattice matching portion (lattice matching portion) to the volume of the entire tunnel barrier layer 3 is estimated by a TEM image, for example. First, a portion of the tunnel barrier layer 3 and the first ferromagnetic metal layer 1 and the second ferromagnetic metal layer 2 is Fourier transformed to obtain an electron beam diffraction image. In the electron beam diffraction image obtained by Fourier transformation, electron beam diffraction spots other than the lamination direction are removed. When the image is subjected to inverse Fourier transformation, an image having information only in the lamination direction can be obtained. In the lattice line in this inverse Fourier image, a portion in which the tunnel barrier layer 3 is continuously connected to both the first ferromagnetic metal layer 1 and the second ferromagnetic metal layer 2 is referred to as a lattice matching portion. In addition, in the lattice line, a portion in which the tunnel barrier layer 3 is not continuously connected to at least one of the first ferromagnetic metal layer 1 and the second ferromagnetic metal layer 2 or a portion in which the lattice line is not detected is referred to as a lattice mismatch portion.

Since the lattice matching portion is continuously connected from the first ferromagnetic metal layer 1 to the second ferromagnetic metal layer 2 via the tunnel barrier layer 3 in the lattice line in the inverse Fourier image, a width ($L_C$) of the lattice matching portion can be measured from the TEM image. On the other hand, similarly, since the lattice mismatch portion is not continuously connected in the lattice line in the inverse Fourier image, a width ($L_I$) of the lattice mismatch portion can be measured from the TEM image. When the width ($L_C$) of the lattice matching portion is set as a numerator and a sum of the width ($L_C$) of lattice matching portion and the width ($L_I$) of the portion not lattice-matched is set as a denominator, the volume ratio of the lattice matching portion to the volume of the entire tunnel barrier layer can be obtained. The TEM image is a cross-sectional image, but has information including the depth. Therefore, it can be believed that the region estimated from the TEM image is proportional to the volume.

Figure 4:
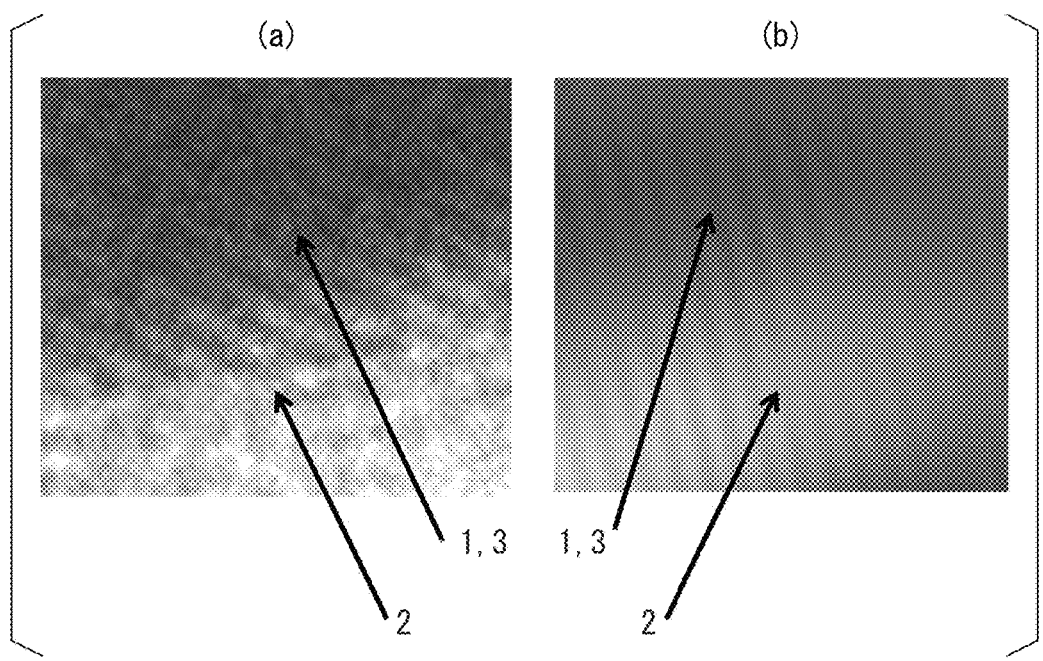
FIG. 4 is an example of a portion in which a tunnel barrier layer and a ferromagnetic metal layer are lattice-matched.

FIG. 4 is an example of a portion in which the tunnel barrier layer and the ferromagnetic metal layer are lattice-matched. FIG. 4(a) is an example of a cross-sectional TEM image of high resolution, and FIG. 4(b) is an example of an image obtained by performing the inverse Fourier transformation after removing electron beam diffraction spots other than the lamination direction in the electron beam diffraction image.

In FIG. 4(b), components perpendicular to the lamination direction are removed and lattice lines can be observed in the lamination direction. This indicates that the tunnel barrier layer and the ferromagnetic metal layer are continuously connected without being disconnected at the interface.

Figure 5:
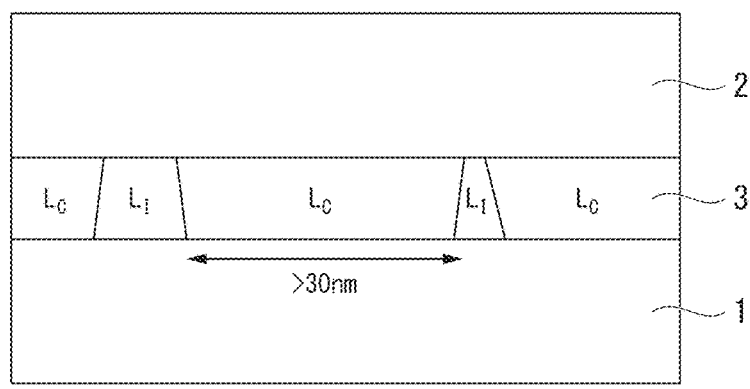
FIG. 5 is structural schematic view of a cross section having a direction parallel to the lamination direction of a tunnel barrier layer 3.

FIG. 5 is a structural schematic view of a cross section having a direction parallel to the lamination direction of the tunnel barrier layer 3. As illustrated in FIG. 5, it is preferable that a size (width: $L_C$) of the lattice matching portion of the tunnel barrier layer 3 parallel to the film surface be 30 nm or less at any portion. 30 nm is approximately 10 times the lattice constant of a CoFe alloy which is the material of the first ferromagnetic metal layer 1 and the second ferromagnetic metal layer 2, and it is believed that mutual interference of spin-polarized electrons in a direction perpendicular to the tunneling direction before and after the coherent tunnel is enhanced aiming about 10 times the lattice constant.

(Shape and Size of Element)

The laminate formed with the first ferromagnetic metal layer 1, the tunnel barrier layer 3, and the second ferromagnetic metal layer 2 which constitute the magnetoresistance effect element 10 has a columnar shape. A shape of the laminate in plan view can have various shapes such as a circle, a square, a triangle, or a polygon, but it is preferable that the shape be circular from a viewpoint of symmetry. In other words, it is preferable that the laminate have a circular columnar shape.

When the laminate has the circular columnar shape, it is preferable that a diameter in plan view be 80 nm or less, more preferably 60 nm or less, and most preferably 30 nm or less. When the diameter is 80 nm or less, a domain structure cannot be formed in the ferromagnetic metal layer, and it is not necessary to take into account the components different from spin polarization in the ferromagnetic metal layer. Further, when the diameter is 30 nm or less, a single domain structure is formed in the ferromagnetic metal layer, and a magnetization reversal rate and probability are improved. In addition, there is a strong demand for a particularly low resistance in miniaturized magnetoresistance effect element.

(Configuration at the Time of Use)

Figure 6:
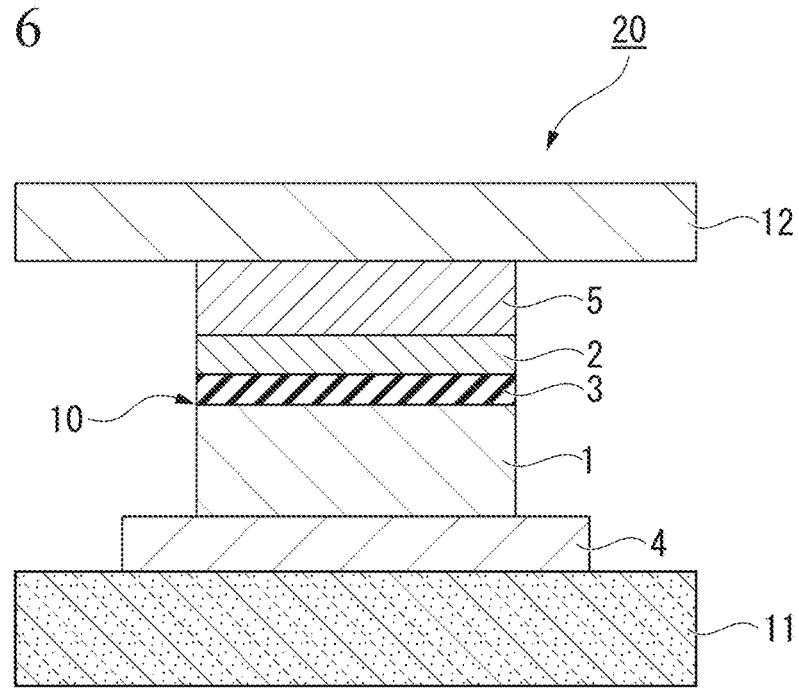
FIG. 6 is a schematic side view of a magnetoresistance effect device including the magnetoresistance effect element according to one aspect of the present invention.
Figure 7:
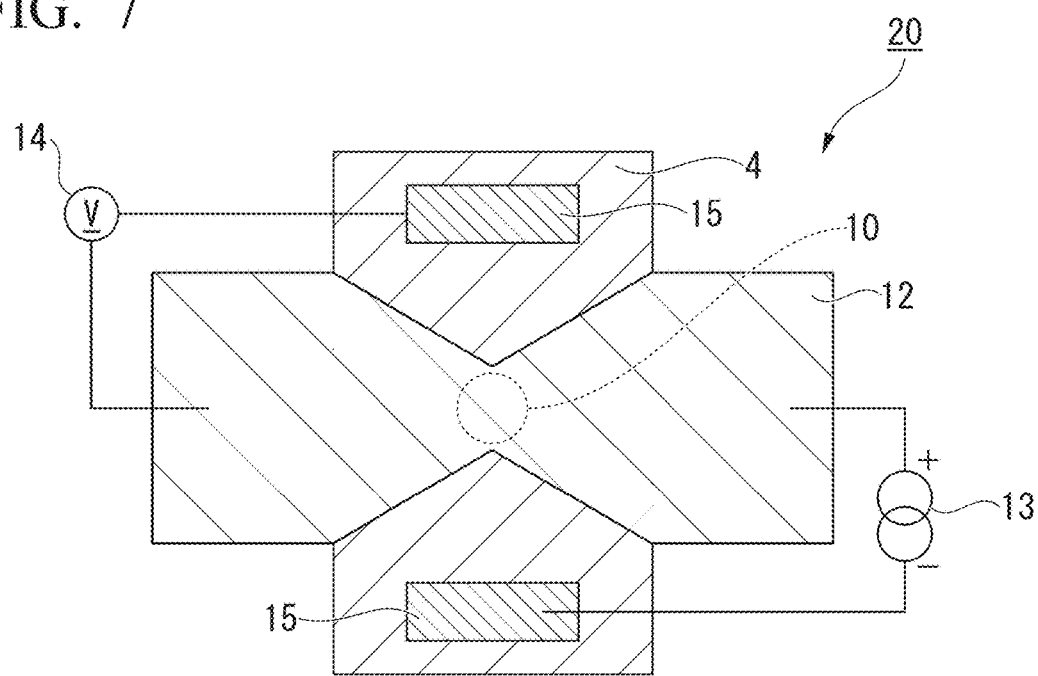
FIG. 7 is a schematic plan view of the magnetoresistance effect device viewed from the lamination direction.

FIG. 6 is a schematic side view of a magnetoresistance effect device including the magnetoresistance effect element according to one aspect of the present invention. FIG. 7 is a schematic plan view of the magnetoresistance effect device viewed from the lamination direction. In a magnetoresistance effect device 20, an electrode layer 12 is formed on a surface of the cap layer 5 illustrated in FIG. 1 on a side opposite to the second ferromagnetic metal layer 2. The underlayer 4 has conductivity and is disposed to cross the electrode layer 12. A power supply 13 and a voltmeter 14 are provided between the underlayer 4 and the electrode layer 12. The underlayer 4, the power supply 13, and the voltmeter 14 are connected by a contact electrode 15. When a voltage is applied to the underlayer 4 and the electrode layer 12 by the power supply 13, the current flows in the lamination direction of the laminate formed with the first ferromagnetic metal layer 1, the tunnel barrier layer 3, and the second ferromagnetic metal layer 2. The applied voltage at this time is monitored by the voltmeter 14.

(Evaluation Method)

An evaluation method of the magnetoresistance effect element will be described with reference to FIGS. 6 and 7. As described above, the power supply 13 and voltmeter 14 are disposed as illustrated in FIG. 7 and a constant current or a constant voltage is applied to the magnetoresistance effect element. By measuring the voltage or current while sweeping a magnetic field from the outside, a change in resistance of the magnetoresistance effect element is observed.

The MR ratio is generally expressed by the following equation.

MR ratio $(\%)=(R_{AP}-R_P)/R_P\times100$ $R_P$ is resistance when the magnetization directions of the first ferromagnetic metal layer 1 and the second ferromagnetic metal layer 2 are parallel to each other, and $R_{AP}$ is resistance when the magnetization directions of the first ferromagnetic metal layer 1 and the second ferromagnetic metal layer 2 are antiparallel.

(Other)

In the present embodiment, although a so-called top pin structure in which the first ferromagnetic metal layer 1 is a magnetization free layer and the second ferromagnetic metal layer 2 is a magnetization fixed layer has been taken as an example of the magnetoresistance effect element 10, the structure of the magnetoresistance effect element 10 is not particularly limited.

Since the magnetization fixed layer normally is formed with a plurality of layers, when the first ferromagnetic metal layer 1 is used as the magnetization fixed layer, a large number of layers are interposed between the underlayer 4 and the tunnel barrier layer 3 and thus the influence of the underlayer 4 on the tunnel barrier layer 3 is reduced. In contrast, in the case of the top pin structure, although the coercive force of the first ferromagnetic metal layer 1 is reduced, the influence of the underlayer 4 on the tunnel barrier layer 3 is increased only with the magnetization free layer which is a single layer interposed between the underlayer 4 and the tunnel barrier layer 3. Therefore, it is possible to further increase the MR ratio of the magnetoresistance effect element 10. The structure of the magnetoresistance effect element 10 may be a so-called bottom pin structure in which the first ferromagnetic metal layer 1 is a magnetization fixed layer and the second ferromagnetic metal layer 2 is a magnetization free layer.

To utilize the magnetoresistance effect element as a magnetic sensor, it is preferable that a change in resistance be linearly changed with respect to an external magnetic field. In a laminated film of general ferromagnetic layers, a magnetization direction is easy to be directed into the laminated surface due to shape anisotropy. In this case, for example, when a magnetic field is applied from the outside and directions of magnetization of the first ferromagnetic metal layer 1 and the second ferromagnetic metal layer 2 are perpendicular to each other, the change in resistance is linearly changed with respect to the external magnetic field. However, in this case, a mechanism for applying a magnetic field close to the magnetoresistance effect element is required, which is not desirable in performing integration. When the ferromagnetic metal layer itself has perpendicular magnetic anisotropy, a method such as applying a magnetic field from the outside or the like is not necessary, which is advantageous in performing integration.

The magnetoresistance effect element utilizing the present embodiment can be used as a magnetic sensor or a memory such as an MRAM. Particularly, the present embodiment is effective in a product used with a bias voltage higher than a bias voltage used in conventional magnetic sensors.

(Manufacturing Method)

The underlayer 4, the first ferromagnetic metal layer 1, the tunnel barrier layer 3, the second ferromagnetic metal layer 2, and the cap layer 5 constituting the magnetoresistance effect element 10 are formed by using a magnetron sputtering device, for example.

The underlayer 4 can be manufactured by a known method. For example, it can be manufactured by a reactive sputtering method using a mixed gas containing Ar and nitrogen as a sputtering gas.

The tunnel barrier layer 3 can be manufactured by a known method. For example, it is formed by sputtering a metal thin film on the first ferromagnetic metal layer 1, plasma oxidation or natural oxidation by introducing oxygen , and subsequent heat treatment. As a film forming method, it is also possible to employ normal thin film forming methods such as a vapor deposition method, a laser ablation method, and a molecular beam epitaxy (MBE) method in addition to the magnetron sputtering method.

The first ferromagnetic metal layer 1, the second ferromagnetic metal layer 2, and the cap layer 5 can be manufactured by known methods.

Films of the underlayer 4, the first ferromagnetic metal layer 1, the tunnel barrier layer 3, the second ferromagnetic metal layer 2, and the cap layer 5 are formed and laminated in that order. It is preferable to perform annealing treatment on the obtained laminated film. The layer formed by the reactive sputtering is amorphous and needs to be crystallized. For example, when Co—Fe—B is used as the ferromagnetic metal layer, a part of B is crystallized by being annealed.

The MR ratio improves in the magnetoresistance effect element 10 manufactured by annealing treatment as compared with the magnetoresistance effect element 10 manufactured without annealing treatment. It is thought that this is because the underlayer 4 is partially crystallized by the annealing treatment, and thereby the uniformity of the crystal size and the orientation in the tunnel barrier layer of the tunnel barrier layer 3 are improved.

As the annealing treatment, it is preferable that heating is performed in an inert atmosphere such as Ar at a temperature of 300° C. or more and 500° C. or less for 5 minutes or more and 100 minutes or less, and then heating is performed in a state in which a magnetic field of 2 kOe or more and 10 kOe or less is applied at a temperature of 100° C. or more and 500° C. or less for 1 hour or more and 10 hours or less.

EXAMPLES (Determination of Lattice Constant of Underlayer)

A lattice constant of the underlayer was obtained using the site of National Institute For Materials Science, "AtomWork" (accessed on Aug. 23, 2016, URL: http://crystdb.nims.go.jp/). The site of National Institute For Materials Science, "AtomWork" is prepared on the basis of Inorganic Materials Database for Exploring the Nature of Material. Jpn. J. Appl. Phys. 50 (2011) 11RH02. The underlayer of the present example using nitride has an amorphous structure and the crystal structure thereof cannot be analyzed. To verify a crystal lattice relationship between the tunnel barrier layer and the underlayer, in the respective nitrides from the site of National Institute For Materials Science, "AtomWork", lattice constants of the results in which the crystal structure is NaCl structure and the space group is Fm-3m are shown in Table 1.

(Determination of Lattice Constant of Tunnel Barrier Layer)

As a structural analysis of the tunnel barrier layer, the crystal structure and the lattice constant were evaluated. The crystal structure was evaluated by an electron diffraction image using transmission electron beams. In a case in which a spinel material other than MgO was used, when a structure of the barrier layer was investigated by this method, when there is no reflection from {022} plane appearing in the ordered spinel structure, this barrier layer was assumed to be a spinel structure in which cations of the cubic crystal were disordered (Sukenel structure).

The lattice constant of the tunnel barrier layer was evaluated using 4-axis X-ray diffractometer. In the evaluation of the lattice constant, it is difficult to determine the lattice constant with the film thickness of the tunnel barrier layer of the example.

Therefore, as a preliminary measurement, to obtain the lattice constant, a Si substrate with thermal oxide film on which a tunnel barrier layer (thickness 100 nm) was formed was used. A surface of the Si substrate with thermal oxide film is amorphous SiOx and there is less susceptibility when the tunnel barrier layer is formed thereon. In addition, the tunnel barrier layer (thickness 100 nm) is a film thickness enough to mitigate the influence of lattice distortion due to the substrate and is a film thickness that can bear X-ray intensity for sufficient structural analysis.

Further, in the present example, the underlayer, the first ferromagnetic metal layer, and the tunnel barrier layer are formed in that order.

In this case, an influence of the crystal lattice of the underlayer affects the tunnel barrier layer via the first ferromagnetic metal layer. Therefore, if the first ferromagnetic metal layer is not influenced by the crystal lattice from the underlayer, the tunnel barrier layer is not influenced. In the present example, at least the film thickness of the first ferromagnetic metal layer is set to 10 nm or less to allow the influence of the crystal lattice of the underlayer to be affected to the tunnel barrier layer via the first ferromagnetic metal layer. Specifically, the film thickness of the tunnel barrier layer was set to 5 nm.

Therefore, the film thickness obtainable in the example is not completely identical with the preliminary measurement, but conditions other than the influence from the underlayer and difference in film thickness are made to coincide, and thus the lattice constant obtained from the preliminary measurement can be regarded as the lattice constant obtainable in the example. In the tunnel barrier layer, the lattice constant was obtained as the rock salt structure in the case of MgO, and the lattice constants were obtained as the Sukenel structure in the case of $MgAl_2O_4$, $ZnAl_2O_4$, and $\gamma\text{-}Al_2O_3$.

TABLE 1

| Underlayer | Lattice constant [nm] |
|---|---|
| TiN | 0.4241 |
| NbN | 0.4391 |
| VN | 0.4134 |
| HfN | 0.4525 |
| TaN | 0.4330 |
| MoN | 0.4188 |
| GaN | 0.4006 |
| ZrN | 0.4573 |
| AlN | 0.3956 |
| CeN | 0.5021 |

| Tunnel barrier layer | Lattice constant [nm] |
|---|---|
| MgO | 0.4213 |
| $MgAl_2O_4$ | 0.4042 |
| $\gamma\text{-}Al_2O_3$ | 0.3955 |
| $ZnAl_2O_4$ | 0.4031 |

From the results of the lattice constants shown in Table 1, the degrees of lattice matching between the underlayer and the tunnel barrier layer were obtained.

The results are shown in Table 2.

TABLE 2

| | | Tunnel barrier layer | | | |
|---|---|---|---|---|---|
| | | MgO | $MgAl_2O_4$ | $ZnAl_2O_4$ | $\gamma\text{-}Al_2O_3$ |
| Underlayer | TiN | 0.7 | 4.7 | 5.0 | 6.7 |
| | NbN | 4.1 | 8.0 | 8.2 | 9.9 |
| | VN | 1.9 | 2.3 | 2.5 | 4.3 |
| | HfN | 6.9 | 10.7 | 10.9 | 12.6 |
| | TaN | 2.7 | 6.7 | 6.9 | 8.7 |
| | MoN | 0.6 | 3.4 | 3.7 | 5.6 |
| | GaN | 5.2 | 0.9 | 0.6 | 1.3 |
| | ZrN | 7.9 | 11.6 | 11.9 | 13.5 |
| | AlN | 6.5 | 2.2 | 1.9 | 0.0 |
| | CeN | 16.1 | 19.5 | 19.7 | 21.2 |

Next, a magnetoresistance effect element was actually manufactured and the MR ratio of the magnetoresistance effect element was measured. Actual measurement of the MR ratio was conducted for a part of the combination of the tunnel barrier layer and the underlayer described above.

Example 1

A magnetoresistance effect element in which the tunnel barrier layer was made of MgO and the underlayer was made of TiN was manufactured.

Hereinafter, a method of manufacturing the magnetoresistance effect element of Example 1 will be specifically described.

Each layer was formed on the substrate 11 on which a thermally oxidized silicon film is provided by magnetron sputtering. First, TiN was deposited to a thickness of 40 nm as the underlayer on an upper surface of the substrate. Thereafter, the underlayer was polished by a chemical mechanical polishing (CMP) so that the underlayer had a thickness about 10 nm. The underlayer was formed by a reactive sputtering method using a TiN target as the target and using a mixed gas containing Ar and nitrogen in a volume ratio of 1:1 as the sputtering gas. Thereafter, $Co_{74}Fe_{26}$ was formed to a thickness of 5 nm as the first ferromagnetic metal layer, and MgO was formed to a thickness of 8.5 nm as the tunnel barrier layer.

Then, CoFe 7 nm, Ru 0.8 nm, CoFe 10 nm, and IrMn 12 nm were formed in that order as the second ferromagnetic metal layer 2 on the tunnel barrier layer. Further, Ru 3 nm and Ta 5 nm were formed as the cap layer 5.

The above-described laminated film was placed in an annealing apparatus, treated in Ar at a temperature of 450° C. for 10 minutes, and then treated at a temperature of 280° C. for 6 hours in a state in which a magnetic field of 8 kOe was applied.

Next, an element with a configuration illustrated in FIGS. 6 and 7 was manufactured. First, the electrode layer 12 was formed on the cap layer 5. Next, a photoresist was formed to be in a direction rotated by 90 degrees from the electrode layer 12 using electron beam lithography. A portion other than under the photoresist was removed by ion milling method and the thermally oxidized silicon film which is the substrate is exposed to form a shape of the underlayer 4. Further, a photoresist was formed to be a columnar shape of 80 nm using the electron beam lithography on a constricted portion of the underlayer 4 and a portion other than under the photoresist was removed by ion milling method to expose the underlayer 4. Thereafter, SiOx was formed as an insulating layer in a portion scraped by the ion milling. The columnar photoresist of 90 nm was removed here. Only portions of the contact electrode 15 illustrated in FIGS. 6 and 7 were made so that no photoresist was formed and the insulating layer was removed by ion milling to expose the underlayer 4. Thereafter, Au was formed to form the contact electrode 15.

(Structural Analysis of Tunnel Barrier Layer)

Structural analysis of the tunnel barrier layer was evaluated by electron diffraction image using transmission electron beams. Examination of the structure of the barrier layer by this method revealed that indexing due to symmetry of the space group Pm3m can be performed and the tunnel barrier layer had NaCl structure.

Example 2

A magnetoresistance effect element was manufactured in the same manner as in Example 1 except that the underlayer was made of MoN.

Comparative Example 1

A magnetoresistance effect element was manufactured in the same manner as in Example 1 except that the underlayer was made of CeN.

Comparative Example 2

A magnetoresistance effect element was manufactured in the same manner as in Example 1 except that the underlayer was made of Cu.

Example 3

A magnetoresistance effect element was manufactured in the same manner as in Example 1 except that the tunnel barrier layer was made of $MgAl_2O_4$ and the underlayer was made of TiN. Examination of the structure of the barrier layer revealed that there was no reflection from {022} plane or {111} plane appearing in the ordered spinel structure, and this tunnel barrier layer had a spinel structure in which cations of the cubic crystal were disordered (Sukenel structure).

Example 4

A magnetoresistance effect element was manufactured in the same manner as in Example 3 except that the underlayer was made of VN.

Comparative Example 3

A magnetoresistance effect element was manufactured in the same manner as in Example 3 except that the underlayer was made of TaN.

Example 5

A magnetoresistance effect element was manufactured in the same manner as in Example 1 except that the tunnel barrier layer was made of $ZnAl_2O_4$ and the underlayer was made of TiN. Examination of the structure of the barrier layer revealed that there was no reflection from {022} plane appearing in the ordered spinel structure, and this tunnel barrier layer had a spinel structure in which cations of the cubic crystal were disordered (Sukenel structure).

Example 6

A magnetoresistance effect element was manufactured in the same manner as in Example 5 except that the underlayer was made of VN.

Comparative Example 4

A magnetoresistance effect element was manufactured in the same manner as in Example 5 except that the underlayer was made of TaN.

Example 7

A magnetoresistance effect element was manufactured in the same manner as in Example 1 except that the tunnel barrier layer was made of $\gamma$-$Al_2O_3$ and the underlayer was made of VN. Examination of the structure of the barrier layer revealed that there was no reflection from {022} plane appearing in the ordered spinel structure, and the tunnel barrier layer had a spinel structure in which cations of the cubic crystal were disordered (Sukenel structure).

Comparative Example 5

A magnetoresistance effect element was manufactured in the same manner as in Example 7 except that the underlayer was made of TaN.

In accordance with the above evaluation method, a sheet resistance value (RA) and a MR ratio of the obtained magnetoresistance effect element were measured. Then, a relationship between the measured MR ratio and the degree of lattice matching is shown in Table 3.

Further, the RA is one obtained by dividing the resistance value, obtained by dividing the applied bias voltage by a current flowing in the lamination direction of the magnetoresistance effect element, by the area of the surfaces in which each layer is bonded, and then normalized to a resistance value in a unit area, and the unit thereof is $\Omega \cdot \mu m^2$.

The applied bias voltage and the current value flowing in the lamination direction of the magnetoresistance effect element can be measured and obtained with a voltmeter and ammeter.

TABLE 3

| | Underlayer | Tunnel barrier layer | Degree of lattice mismatching | RA | MR ratio |
|---|---|---|---|---|---|
| Example 1 | TiN | MgO | 0.7 | 0.46 | 101.1 |
| Example 2 | TaN | MgO | 2.7 | 0.49 | 86.0 |
| Comparative example 1 | CeN | MgO | 16.1 | 0.59 | 33.3 |
| Comparative example 2 | Cu | MgO | 15.6 | 6 | 32.1 |
| Example 3 | TiN | MgAl$_2$O$_4$ | 4.7 | 0.69 | 106.3 |
| Example 4 | VN | MgAl$_2$O$_4$ | 2.3 | 0.6 | 120.8 |
| Comparative example 3 | TaN | MgAl$_2$O$_4$ | 6.7 | 0.73 | 68.2 |
| Example 5 | TiN | ZnAl$_2$O$_4$ | 5.0 | 0.7 | 80.2 |
| Example 6 | VN | ZnAl$_2$O$_4$ | 2.5 | 0.6 | 108.8 |
| Comparative example 4 | TaN | ZnAl$_2$O$_4$ | 6.9 | 0.75 | 63 |
| Example 7 | VN | γ-Al$_2$O$_3$ | 4.3 | 0.61 | 113.3 |
| Comparative example 5 | TaN | γ-Al$_2$O$_3$ | 8.7 | 0.73 | 58.8 |

When Examples 1 to 3 and Comparative example 1 are compared, it can be ascertained that the MR ratio improves as the degree of lattice mismatching decreases. Further, since the electrical resistivity of TaN of Example 2 was 135 $\mu\Omega \cdot cm$ and the conductivity was low, the MR ratio decreased. As illustrated in Examples 3 to 7, even when the tunnel barrier layer is changed, it is ascertained that the degree of lattice mismatching and the MR ratio have the same relationship. That is, it can be ascertained that a high MR ratio can be realized when the degree of lattice mismatching is 5% or less in Table 1 shown above, and a very high MR ratio can be realized when the degree of lattice mismatching is 3% or less.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: First ferromagnetic metal layer
2: Second ferromagnetic metal layer
3: Tunnel barrier layer
4: Underlayer
5: Cap layer
10: Magnetoresistance effect element
11: Substrate
12: Electrode layer
13: Power supply
14: Voltmeter
15: Contact electrode

What is claimed is:

1. A magnetoresistance effect element comprising a laminate in which:
an underlayer;
a first ferromagnetic metal layer;
a tunnel barrier layer; and
a second ferromagnetic metal layer are laminated in that order,
wherein the underlayer is made of a nitride,
the tunnel barrier layer is made of any one selected from a group consisting of MgAl$_2$O$_4$, ZnAl$_2$O$_4$, MgO, and γ-Al$_2$O$_3$, and
a degree of lattice mismatching between a lattice constant of the tunnel barrier layer and a lattice constant of a crystal structure to be taken by the underlayer is 5% or less.

2. The magnetoresistance effect element according to claim 1, wherein the crystal structure to be taken by the underlayer is a tetragonal crystal structure.

3. The magnetoresistance effect element according to claim 1, wherein:
the tunnel barrier layer is MgAl$_2$O$_4$ or ZnAl$_2$O$_4$, and
the underlayer is a nitride including any one selected from a group consisting of Ti, V, Mo, Ga, and Al.

4. The magnetoresistance effect element according to claim 1, wherein:
the tunnel barrier layer is MgO; and
the underlayer is a nitride including any one selected from a group consisting of Ti, Nb, V, Ta, and Mo.

5. The magnetoresistance effect element according to claim 1, wherein:
the tunnel barrier layer is γ-Al$_2$O$_3$; and
the underlayer is a nitride including any one selected from a group consisting of V, Ga, and Al.

6. The magnetoresistance effect element according to claim 1, wherein an electrical resistivity of the underlayer is 200 $\mu\Omega \cdot cm$ or less.

7. The magnetoresistance effect element according to claim 1, wherein the first ferromagnetic metal layer and the second ferromagnetic metal layer are made of a ferromagnetic material of which a main component is at least one of Fe and Co.

8. The magnetoresistance effect element according to claim 1, wherein a thickness of the first ferromagnetic metal layer is 3 nm or less.

9. The magnetoresistance effect element according to claim 1, wherein a thickness of the underlayer is 1.0 nm or more and 20.0 nm or less.

10. The magnetoresistance effect element according to claim 1, wherein a cap layer is further laminated on a surface of the second ferromagnetic metal layer opposite to the tunnel barrier layer side.

11. The magnetoresistance effect element according to claim 10, wherein the cap layer is made of a nonmagnetic metal having an atomic number of an atomic number of yttrium or higher.

12. The magnetoresistance effect element according to claim 2, wherein an electrical resistivity of the underlayer is 200 $\mu\Omega \cdot cm$ or less.

13. The magnetoresistance effect element according to claim 3, wherein an electrical resistivity of the underlayer is 200 $\mu\Omega \cdot cm$ or less.

14. The magnetoresistance effect element according to claim 4, wherein an electrical resistivity of the underlayer is 200 µΩ·cm or less.

15. The magnetoresistance effect element according to claim 5, wherein an electrical resistivity of the underlayer is 200 µΩ·cm or less.

16. The magnetoresistance effect element according to claim 2, wherein a thickness of the underlayer is 1.0 nm or more and 20.0 nm or less.

17. The magnetoresistance effect element according to claim 3, wherein a thickness of the underlayer is 1.0 nm or more and 20.0 nm or less.

18. The magnetoresistance effect element according to claim 4, wherein a thickness of the underlayer is 1.0 nm or more and 20.0 nm or less.

19. The magnetoresistance effect element according to claim 5, wherein a thickness of the underlayer is 1.0 nm or more and 20.0 nm or less.

20. The magnetoresistance effect element according to claim 6, wherein a thickness of the underlayer is 1.0 nm or more and 20.0 nm or less.

* * * * *